United States Patent
Kim et al.

[19]

[11] Patent Number: 6,121,818
[45] Date of Patent: Sep. 19, 2000

[54] MIXER USING REPLICA VOLTAGE-CURRENT CONVERTER

[75] Inventors: Ook Kim, Seoul; Jong-Kee Kwon, Daejon-shi; Jong-Ryul Lee, Daejon-shi; Chang-Jun Oh, Daejon-shi; Won-Chul Song, Daejon-shi, all of Rep. of Korea

[73] Assignee: Electronics and Telecommunications Research Institute, Daejon-shi, Rep. of Korea

[21] Appl. No.: 08/970,350

[22] Filed: Nov. 14, 1997

[30] Foreign Application Priority Data

Nov. 18, 1996 [KR] Rep. of Korea ..................... 96-54853

[51] Int. Cl.[7] ........................................ G06F 7/44
[52] U.S. Cl. .................. 327/359; 327/103; 327/563; 330/260; 330/293
[58] Field of Search .................................. 327/103, 116, 327/119, 120, 356, 357, 359, 563; 330/259, 260, 261, 282, 283, 284, 291, 293

[56] References Cited

U.S. PATENT DOCUMENTS

| | | | |
|---|---|---|---|
| 4,172,238 | 10/1979 | Kusakabe | 330/259 |
| 4,937,516 | 6/1990 | Sempel | 323/315 |
| 5,798,664 | 8/1998 | Nagahori et al. | 330/259 |
| 5,838,197 | 11/1998 | Tsukuda | 330/259 |

*Primary Examiner*—Kenneth B. Wells
*Attorney, Agent, or Firm*—Jacobson, Price, Holman & Stern, PLLC

[57] ABSTRACT

The present invention discloses a mixer using a replica voltage-current converter, and more particularly a mixer using the replica voltage-current (V-I) converter of the present invention, which feedbacks the output current of the replica voltage-current converter using an additional amplifier so as to improve the linearity thereof by the gain of the amplifier because the conventional mixer operating at a high speed dissipates a lot of electrical power to have low output impedance.

6 Claims, 3 Drawing Sheets

MIXER USING REPLICA VOLTAGE-CURRENT CONVERTER

FIELD OF THE INVENTION

The present invention generally relates to a mixer using a replica voltage-current converter with a high degree of linearity even at a low supply voltage. In particular, the mixer according to the present invention has an advantage that the performance degradation is low even when a low speed device such as a CMOS device is used, which has relatively low speed compared to that of BJT or MESFET. Accordingly, there is a high demand to implement a CMOS mixer having a low power dissipation which is increasingly required in the relevant industry.

BACKGROUND OF THE INVENTION

The mixer, being a basic block of IC for communication, converts a signal frequency of one band into that of another band. Particularly, in the IC for communication, a low supply power and a low power dissipation are very important because it must operate for a long period of time using a small power supply such as a battery. However, even when the supply power and the power dissipation are low, a high degree of linearity is also required.

The present invention belongs to a technical field which implements a high speed mixer applicable to an IC for communication into an integrated circuit block. In a prior art, it is a general trend to implement a high speed mixer using BJT or MESFET that has large transconductance. However, as the process technology of integrated circuit advances, there has been an increasing need for implementing this kind of mixer using a MOS transistor that is most suitable to the integration density. However, in case of the MOS device, if a conventional technique is used, it is difficult to achieve both high speed operation and small power dissipation. Nevertheless, because the mixer composed of a device with small transconductance, such as a MOS device, operating at a high frequency dissipates large power, an additional part is required to achieve low output impedance. As discussed above, in a prior art, a lot of electrical power must be dissipated in order for the CMOS mixer operating at high speed to have a low output impedance. As a result, there has been a need for implementing the operation of the mixer at low voltage and power that is effective even when using a low speed device, such as CMOS.

SUMMARY OF THE INVENTION

Accordingly, it is an object of the present invention to provide a mixer using a replica voltage-current converter, where the linearity of the mixer can be improved in accordance with the gain of an additional amplifier by feedbacking the current output from the replica voltage-current (V-I) converter using the additional replica V-I converting amplifier.

DESCRIPTION OF THE INVENTION

Below, embodiments of the present invention will be described in detail by reference to the accompanying drawings.

Figure 1:
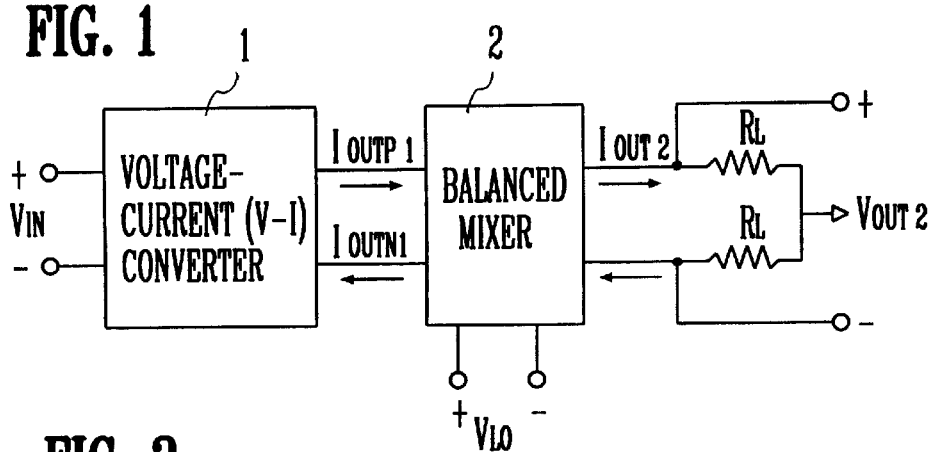
FIG. 1 is a block diagram of a mixer in accordance with the present invention using a voltage-current (V-I) converter and a balanced mixer.

FIG. 1 is a block diagram of a mixer. The voltage-current converter 1 generates output currents $I_{OUTP1}$, $I_{OUTN1}$ using the voltage $V_{IN}$ as an input. A balanced mixer 2 converts the output voltages into a modulated current, which is applied to the output terminal to generate an output voltage $V_{OUT2}$. Generally speaking, the output terminal of the mixer is connected to an additional buffer or uses a resistance device. More particularly, if the output with a high frequency is required, the buffer stage must be operated at such a high speed that a desired amplitude and a linearity can be obtained. However, if the required output frequency is so high that it is difficult for the buffer device to handle it, then a resistance device with a linear characteristic may be used instead. However, in cases of using resistance device, the output impedance necessary for the output must be small enough. Accordingly, the amount of the current flowing through the resistance must be great enough to obtain a great output signal amplitude, resulting in a very great amount of DC current that is sent to the output terminal. In addition, generally, due to the non-linearity of the mixer, additional current is required and power dissipation is increased accordingly because only a small portion of the mixer output can be used. Though a mixer with a low output resistance may be implemented by using a device such as balun, in this case, an additional external component must be used. Accordingly, in the present invention, the current flowing through the output terminal is maximized so that a linearized operation can be obtained to implement a low power dissipation and a high speed even when a desired current necessary for the output swing can be used.

Figure 2:
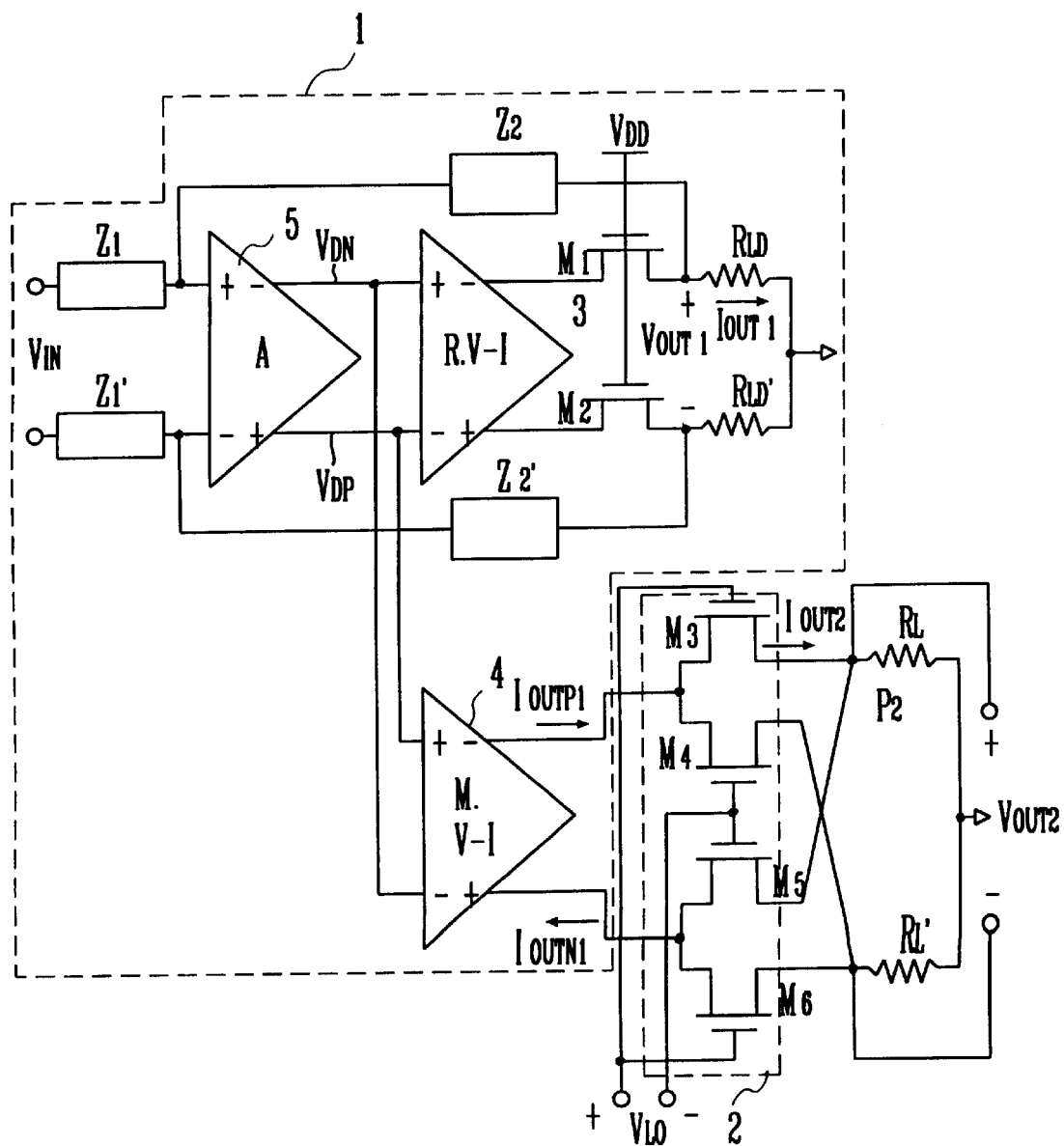
FIG. 2 is a detailed circuit diagram of FIG. 1.

FIG. 2 is a detailed circuit diagram of FIG. 1. The voltage-current (V-I) converter 1 of FIG. 1 consists of a replica voltage-current converter (R. V-I) 3 comprising resistors and an amplifier 5, and of a main voltage-current (M. V-I) converter (M. V-I) 4. The balanced mixer 2 of FIG. 2 consists of NMOS transistors M3, M4, M5 and M6 operating as a switch. The mixer to drive the output terminal is a main voltage-current (M. V-I) converter 4. The driving voltages $V_{DN}$, $V_{DP}$ of the main voltage-current (M. V-I) converter 4 are inputs from the amplifier 5. In this structure, the current flowing through the output terminal is not feedbacked directly but the current output from the replica voltage-current converter (R. V-I) 3 operating in the same manner as the main voltage-current (M. V-I) converter is feedbacked. Though the main voltage-current converter 4 and the replica voltage-current converter 3 have the same structure of and connection to the transistors, the size of the main voltage-current converter 4 is N times larger than that of the replica voltage-current converter 3. That is, it means that the main voltage-current converter 4 can be implemented with a N number of the replica voltage-current converter (R. V-I) 3 connected in parallel. In this case, in view of the input voltage, the current output from the main voltage-current converter 4 becomes N times larger than that from the replica voltage-current converter 3.

Then, as the driving voltages $V_{DN}$, $V_{DP}$ of each of the voltage-current (V-I) converters are identical, the current flowing through the NMOS transistors M1, M2 becomes 1/N of the current output from the main voltage-current converter (M. V-I). This current flows into load resistances $R_{LD}$, $R_{LD}'$, and the voltage that was applied to the load resistance $R_{LD}$, $R_{LD}'$ are feedbacked to the resistance devices Z1, Z1', Z2, Z2'. At this time, if the amplification factor A of the amplifying device is large enough, the driving voltages $V_{DN}$, $V_{DP}$ are adjusted as to maintain the feedback relationship described in [Eq. 1].

That is, when Z1≈Z1', Z2≈Z2'.

$$V_{OUT1} \approx (Z2/Z1)V_{IN} \quad [Eq. 1]$$

Then, if we do not consider the influence of Z2 and Z2', the output current is as follows:

$$I_{OUT1} \approx V_{OUT1}/2R_{LD} \quad [Eq. 2]$$

In this case, even in the voltage-current converter to which the driving voltages $V_{DN}$, $V_{DP}$ are applied, the output current is as follows since it becomes N times:

$$I_{OUT2} \approx N \cdot I_{OUT1} = N(V_{OUT2}/2R_{LD}) = (N \cdot Z2 \cdot V_{IN})/(2R_{LD} \cdot Z1) \quad [Eq. 3]$$

The output voltage is equal [Eq. 4].

$$V_{OUT2} = 2R_L \cdot I_{OUTP2} = (N \cdot R_L \cdot Z2 \cdot V_{IN})/(R_{LD} \cdot Z1) \quad [Eq. 4]$$

Figure 3:
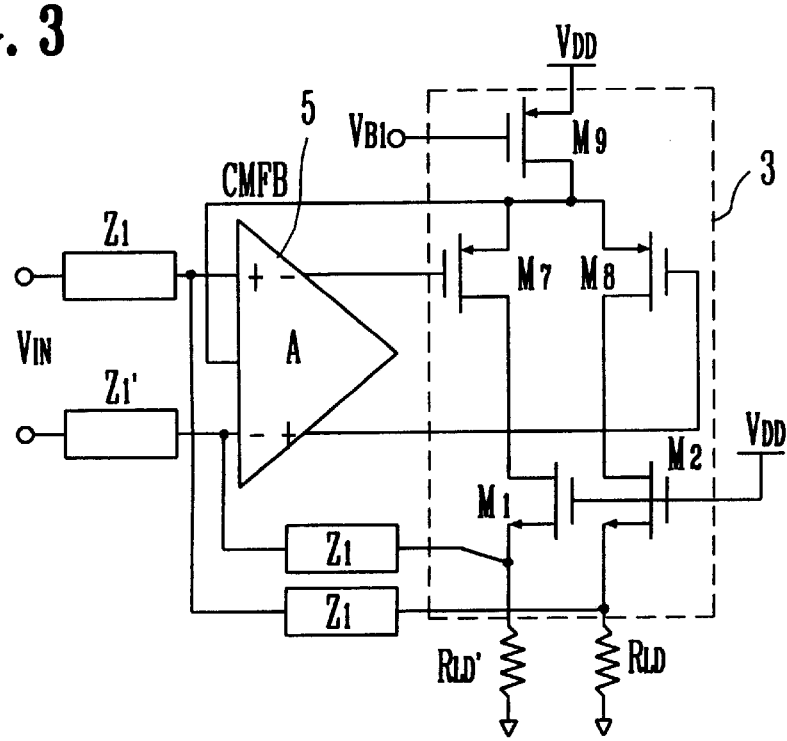
FIG. 3 is a detailed circuit diagram of a replica voltage-current converter (R. V-I) shown in FIG. 2.
Figure 4:
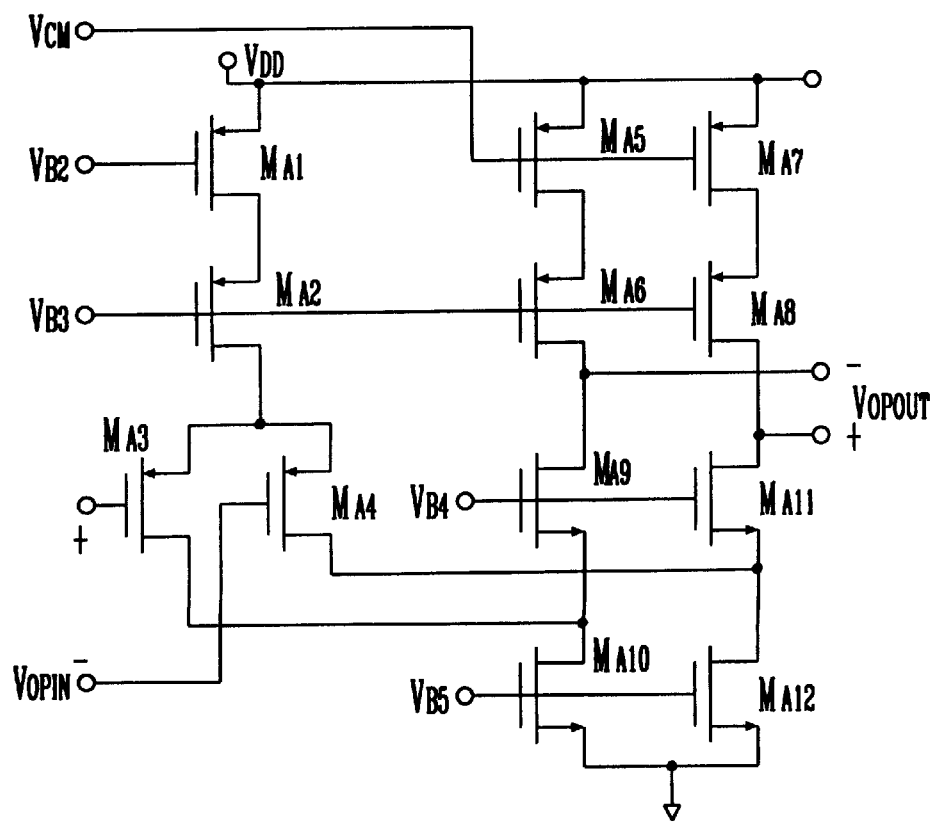
FIG. 4 is a detailed circuit diagram of an amplifier (A) shown in FIG. 2.

FIG. 3 is a detailed circuit diagram of the replica voltage-current converting amplifier.
In this case, the replica voltage-current (R. V-I) converter 3 may use a source coupled pair in which sources thereof are interconnected using MOS transistors M7 and M8. If a linear relationship is required, an additional variable resistor may be used between the sources of the interconnected two transistors M7 and M8.
The amplifier 5 for driving voltages $V_{DN}$, $V_{DP}$ can use a fully differential structure and the example of the construction is shown in FIG. 4. This structure is a folded cascade amplifier with a fully differential structure. The transistors MA3, MA4 amplify the voltage $V_{OPIN}$ at the input terminal of the OP AMP and transfer it to the output terminal. This structure is generally a linear structure and, in order to ensure the stability, the capacitance of the output terminal must have a large value. In this case, since the output terminal of the OP AMP is not only connected to the gate of the replica voltage-current converter (R. V-I) consisted of the transistor M7, M8 but also is connected to the gate of the main voltage-current converter (M. V-I), the capacitance of the output terminal of amplifier 5 has a large value and accordingly this structure has a stable frequency characteristic. The fully differential amplifier needs a common mode feedback ("CMFB"), being an additional circuit, to stabilize the common mode of the output the output of the common mode feedback may use a drain voltage of the transistor M9 in FIG. 3, and if the structure is constructed like this, the drain voltage of the transistor M9 has a constant value regardless of the input voltage, and thereby it makes the current flowing from the supply voltage $V_{DD}$ into the output terminal have a constant value. In this case, the circuit structure of the common mode feedback is shown in FIG. 3.

The structure mentioned above can implement a same mixer when the MOS transistor is replaced with a BJT or a MESFET. That is, even though a MOS transistor operating at a linear region is used here to implement the balanced mixer, a same result can be obtained if a transistor operating at a saturation region is used. Also, if the MOS transistor is substituted by BJT or MESFET, above mentioned effect can be obtained.

Figure 5:
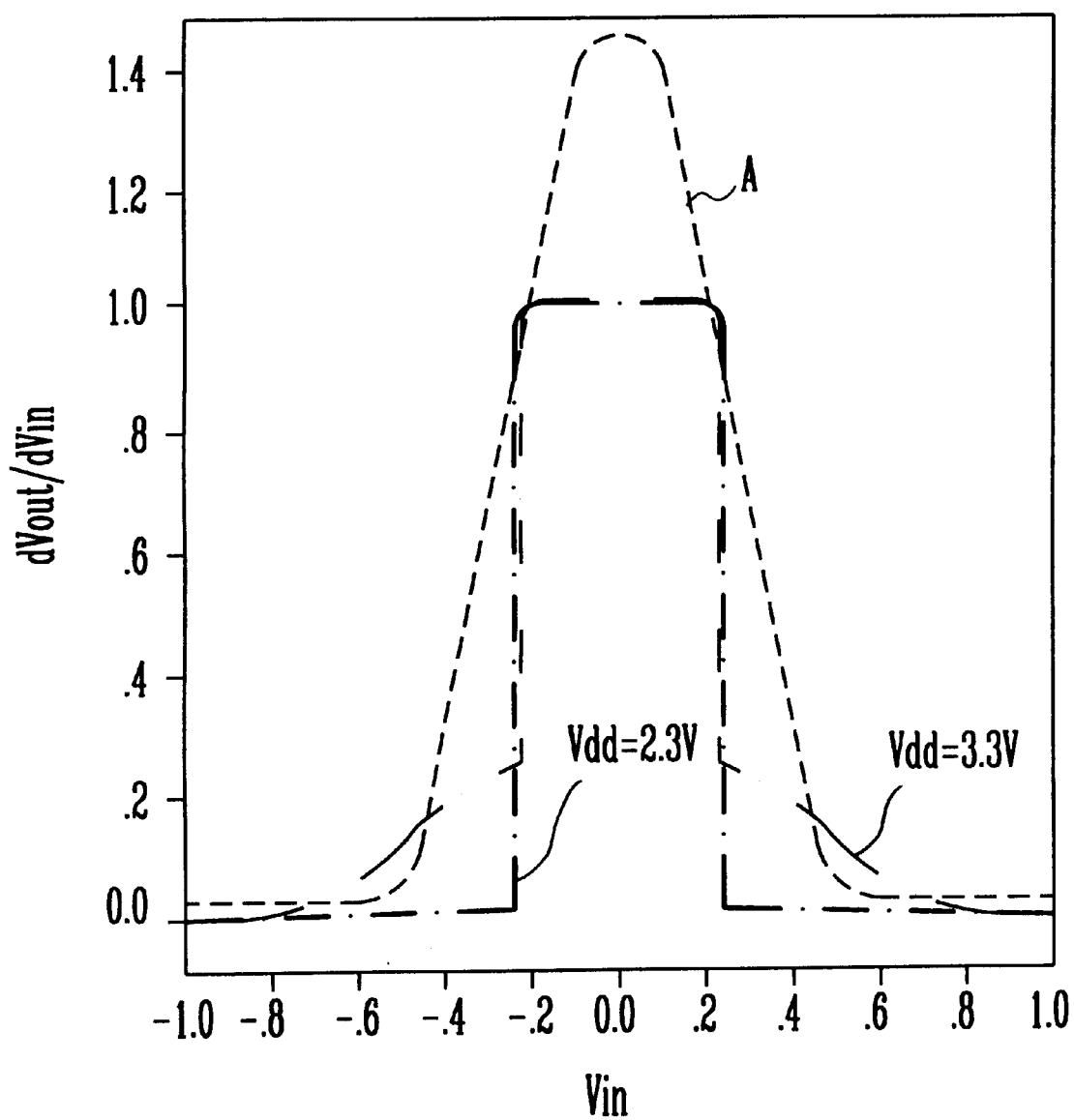
FIG. 5 is a graph illustrating an amplification degree when using a mixer according to the present invention.

FIG. 5 is a graph illustrating an amplification factor when using a mixer according to the present invention, in which the linearity of A is greatly improved by the amplifier.

The present invention has following effects.

What is claimed is:

1. A mixer using a replica voltage-current converter, comprising:

a voltage-current (V-I) transformer including an input amplifier and the replica voltage-current (R. V-I) converter, the replica voltage-current converter generating feedback signals to the input amplifier, wherein said voltage-current (V-I) transformer further includes a main voltage-current (M. V-I) converter for converting a differential voltage outputted from said input amplifier to a differential current and for supplying the differential current as an input of said balanced mixer; load resistors connected to said replica voltage-current (R. V-I) converter for converting differential current output of said replica voltage-current (R. V-I) converter to a voltage level between an output node of said replica voltage-current (R. V-I) converter and a ground node; and feedback resistors for feedbacking a voltage which is applied to both ends of each of said two load resistors connected to said replica voltage-current (R. V-I) converter as the input of said input amplifier;

a balanced mixer connected to said voltage-current (V-I) transformer, for outputting modulated current outputs; and two load resistors connected to said balanced mixer, for converting said modulated current outputs to a voltage output terminal.

2. The mixer using the replica voltage-current converter set forth in claim 1, wherein said replica voltage-current (R. V-I) converter has a structure in which sources of two identical MOS transistors are connected to each other and a current source is connected to the sources of said two MOS transistors, or a structure in which emitters of two identical BJT's are connected to each other and the current source is connected to the emitters of said two BJT's.

3. The mixer using the replica voltage-current converter set forth in claim 1, wherein said feedback resistors consist of one of a resistor, a capacitor or a device in which a resistor/a capacitor are connected in parallel or in serial to have a filtering function.

4. The mixer using the replica voltage-current converter set forth in claim 1, wherein said main voltage-current (M. V-I) converter is comprised of a plurality of said replica voltage-current (R. V-I) converters that are connected in parallel in order for the output current of said main voltage-current (M. V-I) converter to be the same as the number of the replica voltage-current converter multiplied by the output current of said replica voltage-current (R. V-I) converter.

5. The mixer using the replica voltage-current converter set forth in claim 1, wherein said main voltage-current (M. V-I) converter has the same structure as said replica voltage-current (R. V-I) converter except the width of all the transistors of said replica voltage-current (R. V-I) converter are N times larger in order for the output current of said main voltage-current (M. V-I) converter to become N times of the output current of said replica voltage-current (R. V-I) converter.

6. The mixer using replica voltage-current converter set forth in claim 1, wherein said balanced mixer includes two double balanced transistor pairs, each pair connected to the output node of said main voltage-current (M. V-I) converter, wherein the other sides of transistors which consist of double balanced pairs are connected to said load resistors.

* * * * *